United States Patent
Yamamoto et al.

(10) Patent No.: US 6,700,302 B1
(45) Date of Patent: Mar. 2, 2004

(54) PIEZOELECTRIC RESONATOR

(75) Inventors: Takashi Yamamoto, Ishikawa-ken (JP); Yuko Yokoi, Toyama-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/620,539

(22) Filed: Jul. 22, 2000

(30) Foreign Application Priority Data

Jul. 23, 1999 (JP) .......................................... 11-209964

(51) Int. Cl.⁷ .............................................. H01L 41/08
(52) U.S. Cl. ...................................................... 310/320
(58) Field of Search ................................ 310/366, 330, 310/367, 351, 352, 356, 345, 320; 333/189; H03H 9/10, 9/17

(56) References Cited

U.S. PATENT DOCUMENTS

| | | | |
|---|---|---|---|
| 2,410,825 A | * 11/1946 | Iane | 310/352 |
| 2,429,414 A | * 10/1947 | Kuenstler | 310/356 |
| 4,492,892 A | * 1/1985 | Nakatani | 310/345 |
| 4,568,849 A | * 2/1986 | Sato et al. | 200/181 |
| 5,045,744 A | * 9/1991 | Ando | 310/366 |
| 5,717,365 A | * 2/1998 | Kaida | 310/367 |
| 5,844,452 A | * 12/1998 | Yamamoto | 310/368 |
| 6,046,530 A | * 4/2000 | Funaki | 310/351 |

FOREIGN PATENT DOCUMENTS

| | | |
|---|---|---|
| DE | 31 48 389 A1 | 6/1982 |
| EP | 0 884 840 A2 | 12/1998 |
| JP | 39-8457 | 4/1964 |
| JP | 57-073512 A | 8/1982 |
| JP | 59-160306 | 9/1984 |
| JP | 63-24658 | 7/1988 |
| JP | 5-267984 | 10/1993 |
| JP | 5-88028 | 11/1993 |
| KR | 1999-0036534 | 5/1999 |
| KR | 1999-0036873 | 5/1999 |

* cited by examiner

Primary Examiner—Nicholas Ponomarenko
Assistant Examiner—Karen Addison
(74) Attorney, Agent, or Firm—Keating & Bennett, LLP

(57) ABSTRACT

A piezoelectric resonator includes an internal electrode sandwiched between two layers of ceramic piezoelectric substrates each having a substantially square shape. Surface electrodes are arranged on the front surface and the back surface of the piezoelectric substrate. Both of the piezoelectric substrates are polarization-treated in the substantially perpendicular direction relative to the main surfaces and in the opposite directions with respect to the sandwiched internal electrode. When a signal voltage is applied across the surface electrodes, the piezoelectric resonator is bending-deformed so as to become convex on one side of the main surfaces and become concave on the other side thereof.

10 Claims, 16 Drawing Sheets

PIEZOELECTRIC RESONATOR

BACKGROUND OF THE INVENTION

1. Field of the Invention

The present invention relates to a piezoelectric resonator using bending vibration, and a piezoelectric component.

2. Description of the Related Art

Conventionally, band resonators having a frequency of 300 kHz to 800 kHz have used the radial vibration of a ceramic piezoelectric element. A piezoelectric resonator 1 (hereinafter, referred to as a radial resonator) utilizing the radial vibration is constructed by forming surface electrodes 3 on the front surface and back surface of a square piezoelectric substrate 2, and polarization-treating the piezoelectric substrate 2 in the direction perpendicular to the main surfaces of the piezoelectric substrate 2, as shown in FIG. 1 (the polarization direction of the piezoelectric substrate 2 is indicated by arrows in FIG. 1). Regarding the above-mentioned radial resonator 1, when a signal is applied across the surface electrodes 3, the piezoelectric substrate 2 is expanded and deformed in a direction toward the periphery of the substrate 2 in a plane that is parallel to both main surfaces.

Regarding the radial resonator 1, the product of the length of one side and the resonant frequency fr is substantially constant, and expressed by: Ls×fr=Cs, in which Cs represents a constant, that is, $Cs \approx 2100$ mm·kHz;. For example, if a resonator having the resonant frequency as fr=350 kHz is desired, the length Ls of one side of the resonator is 6 mm.

However, the size of such a component is not acceptable or usable in electronic components which require lighter, thinner, and shorter components. Thus, much smaller piezoelectric resonators are required.

SUMMARY OF THE INVENTION

To solve the above-described technical problems, preferred embodiments of the present invention provide a piezoelectric resonator utilizing bending vibration, having a very small and greatly reduced size, and a piezoelectric component including such a piezoelectric resonator.

According to the first preferred embodiment of the present invention, a piezoelectric resonator includes piezoelectric layers disposed on both surfaces of an internal electrode, respectively, and surface electrodes disposed on the outer main surfaces of the piezoelectric layer, respectively, both the piezoelectric layers being polarized so that the polarization directions of both the piezoelectric layers are substantially perpendicular to the inner electrode, and are opposite to each other with respect to the internal electrode.

Regarding the above-described piezoelectric resonator, when a signal is applied between both the surface electrodes, the resonator is deflected so as to become convex or concave, that is, so as to be bending-deformed on the main surfaces thereof. In this vibration mode, the constant that represents the product of the length of one side of the piezoelectric resonator and the resonant frequency decreases. Thus, the length of one side of the piezoelectric resonator can be shortened if the same frequency band is used. Thus, the size of the piezoelectric resonator can be greatly reduced.

Preferably, the piezoelectric resonator is placed in a case and supported at the nodes or the vicinities of the nodes of the piezoelectric resonator, and external terminals electrically connected to the surface electrodes of the piezoelectric resonator are provided on the outside of the case.

Since the piezoelectric resonator according to this preferred embodiment of the present invention is placed in the case, and the external terminals are provided on the outside of the case, the piezoelectric component can be downsized and the same frequency band is used. Further, since the piezoelectric resonator in the case is supported at the nodes or the vicinities of the nodes, damping of the vibration is prevented even though the piezoelectric resonator is mounted in the case.

Also preferably, in the piezoelectric component according to this preferred embodiment of the present invention, the case includes a case body and a cap covering the base body, protuberances provided on one of the upper surface of the case body and the lower surface of the cap are contacted with the nodes or the vicinities of the nodes of the piezoelectric resonator, and the nodes or the vicinities of the nodes of the piezoelectric resonator are elastically pressed by a metallic spring terminal inserted between the other of the upper surface of the base body and the lower surface of the cap, and the piezoelectric resonator. The term "electro-conductive cap" includes a cap made of an insulation material, having an electro-conductive film disposed on the surface thereof, in addition to a cap made of a material having electro-conductive properties.

In this instance, since one of the lower surface or the upper surface of the piezoelectric resonator is pressed by protuberances, and the other is pressed by the metallic spring terminal, only one metallic spring terminal is required, and therefore, the cost is greatly reduced and assemblage of the piezoelectric component is easily performed.

Still preferably, the case includes a case body and an electro-conductive cap covering the case body, a pair of the external electrodes are provided on the lower surface of the case body, a pair of internal connection electrodes connected to the external electrodes, respectively, are provided on the upper surface of the case body, Liprotuberances provided on the upper surface of the case body are contacted with the nodes of the piezoelectric resonator and the vicinities of the nodes, at least one of the protuberances includes an electro-conductive material and is arranged on one of the internal connection electrodes, the nodes and the vicinities of the nodes of the piezoelectric resonator are elastically pressed by a metallic spring terminal inserted between the lower surface of the cap and the piezoelectric resonator, and the metallic spring terminal is electrically connected to the other internal connection electrode via the cap.

Accordingly, since the lower surface of the piezoelectric resonator is supported by the protuberances, and only the upper surface thereof is pressed by the metallic spring terminal, only one metallic spring terminal is required. Thus, the cost is greatly reduced and assemblage of the piezoelectric component is easily performed. Moreover, since at least one of the protuberances is preferably made of an electro-conductive material and arranged on one of the internal connection electrodes, the nodes or the vicinities of the nodes of the piezoelectric resonator are elastically pressed by the metallic spring terminal inserted between the lower surface of the cap and the piezoelectric resonator, and the metallic spring terminal is electrically connected to the other internal connection electrode via the cap, one of the surface electrodes of the piezoelectric resonator can be electrically connected to one of the external terminals via the electro-conductive protuberance, and the other surface electrode of the piezoelectric resonator can be electrically connected to the other external terminal via the metallic spring terminal and the electro-conductive cap. Thus, wiring connection steps for connecting lead wires can be omitted.

Preferably, the case includes a case body and a cap covering the case body, and a first metallic spring terminal, the piezoelectric resonator, and a second metallic spring terminal are inserted between the case body and the cap, and the nodes or the vicinities of the nodes of the piezoelectric resonator are elastically pressed by both the metallic spring terminals.

Since the piezoelectric resonator is sandwiched and held between the metallic spring terminals from both sides thereof, the piezoelectric resonator is very securely supported, due to the elasticity of both the metallic spring terminals.

Still preferably, the case includes a case body and an electro-conductive cap covering the case body. A pair of the external terminals are provided on the lower surface of the case body. A pair of the internal connection electrodes that are electrically connected to the respective external terminals are provided on the upper surface of the case body. A first metallic spring terminal, the piezoelectric resonator, and a second metallic spring terminal are inserted between the case body and the cap. The nodes and the vicinities of the nodes of the piezoelectric resonator are elastically sandwiched and held between both the metallic spring terminals. The first metallic spring terminal positioned on the lower surface of the piezoelectric resonator is in contact with one of the internal connection electrodes. The second metallic spring terminal positioned on the upper surface of the piezoelectric resonator is electrically connected to the other internal connection electrode via the cap.

Since the piezoelectric resonator is sandwiched and held by the metallic spring terminals from both sides thereof, the piezoelectric resonator is securely supported, due to the elasticity of both the metallic spring terminals. Further, since the first metallic spring terminal positioned on the lower surface of the piezoelectric resonator is in contact with one of the internal connection electrodes, and the second metallic spring terminal positioned on the upper surface of the piezoelectric resonator is electrically connected to the other internal connection electrode, one of the surface electrodes of the piezoelectric resonator can be electrically connected to one of the external terminals via the first metallic spring terminal, and the other surface electrode of the piezoelectric resonator can be electrically connected to the other external terminal via the second metallic spring terminal and the electro-conductive cap. Thus, wiring connection steps using lead wires or the like can be omitted.

Also preferably, the piezoelectric resonator is mounted and accurately located by positioning portions arranged to protrude from the inner peripheral surface of the case body, at the positions thereof opposed to the respective nodes and the vicinities of the nodes of the piezoelectric resonator, and the metallic spring terminal is positioned by inserting the end portions of the metallic spring terminal into concavities formed in at least a portion of the positioning portions.

As described above, since the metallic spring terminals are positioned by utilizing the positioning portions for positioning the piezoelectric resonator, the structure of the case body is greatly simplified. In addition, since the metallic spring terminal is positioned by inserting the end portions of the metallic spring terminal into the concavities of the positioning portions, the metallic spring terminal is securely positioned.

Still preferably, since the piezoelectric resonator is positioned by the positioning portions protruding from the inner peripheral surface of the case body, at the positions thereof opposed to the respective nodes and the vicinities of the nodes of the piezoelectric resonator, and the end surfaces of the metallic spring terminal are contacted with the positioning portions at least at two positions whereby the metallic spring terminal is prevented from rotating.

Since the metallic spring terminal is positioned by utilizing the positioning portions for positioning the piezoelectric resonator, the structure of the case body itself is greatly simplified. Further, since the positioning portions are contacted with the end surfaces of the metallic spring terminal, whereby the metallic spring terminal is prevented from rotating, the structure of the positioning portions is not complicated, and the incorporation of the metallic spring terminal is easily performed.

A load capacitance element may be mounted on the case body in the space between the metallic spring terminal arranged on the lower surface of the piezoelectric resonator and the case body.

Since the load capacitance element is mounted in the space between the metallic spring terminal and the case body, the load capacitance element can be mounted without the outer dimension of the piezoelectric component being Li increased.

Also preferably, the case includes an inner case and an outer case having a box shape to accommodate the inner case, the piezoelectric resonator inclined by about 45° relative to the inner case is placed in the inner case, one of two metallic spring terminals each having a lead external terminal extended substantially at 45° relative to the two legs is arranged on the front surface of the piezoelectric resonator to press the nodes at two opposed positions, and the other metallic spring terminal is arranged on the back surface of the piezoelectric resonator to press the nodes at the remaining two positions.

A lead type piezoelectric component can be constructed by use of the piezoelectric resonator according to the above-described preferred embodiment of the present invention. Thus, the lead-type piezoelectric component has a greatly reduced and very small size while still using the same service frequency band.

Moreover, since the piezoelectric resonator is pressed only at two positions on the front surface and at two positions on the back surface thereof different from those on the front surface, damping of the vibration of the piezoelectric resonator is prevented. Further, though one of the two metallic spring terminals presses the nodes at the two positions and the other presses the nodes at two positions that are different from the above-mentioned positions, the two metallic spring terminals of the same shape and size can be used and their leads can be led out in a substantially parallel manner, since the two metallic spring terminals, each inclined at an angle of about 45° relative to the inner case, are placed into the inner case, and the lead type external-terminals each are led out at an angle of about 45° relative to the two legs, respectively. Accordingly, the cost of the metallic spring terminals can be greatly reduced.

Other features, characteristics, elements and advantages of the present invention will become apparent from the following description of preferred embodiments thereof with reference to the attached drawings.

DETAILED DESCRIPTION OF PREFERRED EMBODIMENTS

Figure 2A:
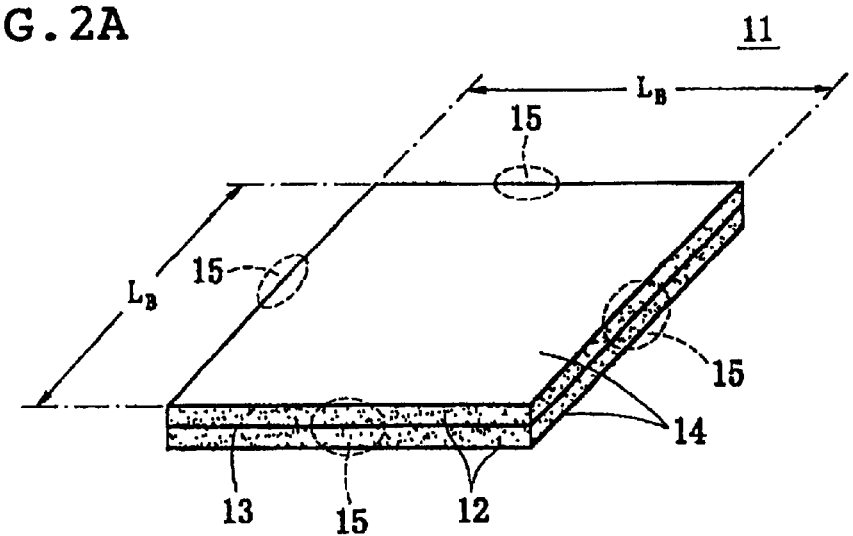
FIGS. 2A and 2B are a perspective view and a cross-sectional view each showing a piezoelectric resonator according to a preferred embodiment of the present invention.
Figure 2B:
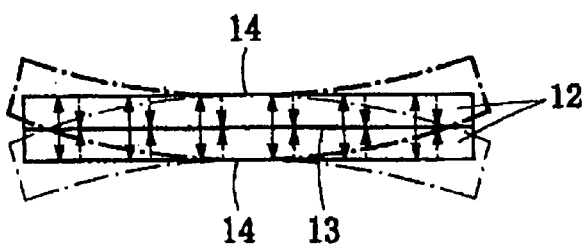

FIGS. 2A and 2B are a perspective view and a cross-sectional view each showing a piezoelectric resonator 11 according to a preferred embodiment of the present invention. The piezoelectric resonator 11 is preferably used as a ceramic oscillator in approximately a 300 kHz to 800 kHz band, for example. The piezoelectric resonator 11 is preferably constructed by sandwiching an internal electrode 13 between two ceramic piezoelectric substrate layers 12 each preferably having a substantially square shape, and further forming surface electrodes 14 wholly on both the front surface and the rear surface of the piezoelectric substrates 12. Both the piezoelectric substrates 12 are polarization-treated in a direction that is substantially perpendicular to the main surfaces, and further, in the opposite directions with respect to the sandwiched internal electrode 13. Regarding the polarization direction, the substrates 12 may be polarized in a direction extending outward from the sandwiched internal electrode 13 as indicated by solid line arrows in FIG. 2B, or may be polarized in the direction inward toward the sandwiched internal electrode 13 as indicated by broken line arrows in FIG. 2B.

When a signal (high frequency electric field) is applied across the surface electrodes 14 of the piezoelectric resonator 11, both the piezoelectric substrates 12 are about to be radially vibrated and stretched in the outer-edge direction. However, the phases of the stretching and the shrinking are inverted. Accordingly, as a whole, as indicated by dashed lines in FIG. 2B, the piezoelectric substrates 12 are bent so that both 1the main surfaces are deformed to become concave and convex alternately, repeatedly (herein after, referred to as bending vibration, and the piezoelectric resonator 11 of preferred embodiments of the present invention is referred to as a bending resonator).

The vibration nodes is of this bending vibration are four points positioned near the centers of the sides of the piezoelectric substrates 12, respectively. In this case, the product of the length $L_B$ of one side of the bending resonator 11 and the resonant frequency fr is substantially constant, and expressed by: $L_B \times fr = C_B$ in which $C_B \cong 430$ mm·kHz. The constant $C_B$ of the bending resonator 11 is about one fifth of the constant $C_S$ of the radial resonator 1 (that is $C_B/C_S \cong 430/2100 = 1/4.88$). Accordingly, if the same resonant frequency fr is used, the length $L_B$ of one side of the bending resonator 11 is about one fifth of the length $L_S$ of one side of the radial resonator 1. More specifically, the bending resonator 11 and the radial resonator 1 each having a resonant frequency fr of about 400 kHz have the sizes listed in the following TABLE 1.

TABLE 1

|  | length of one side | area |
| --- | --- | --- |
| radial resonator | 5.25 mm | 27.6 mm$^2$ |
| bending resonator | 1.07 mm | 1.16 mm$^2$ |

(resonant frequency fr = 400 kHz)

The bending resonator 11 and the radial resonator 1 will be compared below. For the bending resonator 11, the length of one side is about one fifth of that of the radial resonator 1, and the area is about one twenty-fourth. Accordingly, the resonator size can be considerably reduced by using the bending resonator 11, as compared with that by using the radial resonator, on condition that the same resonant frequency fr is used.

Figure 3:
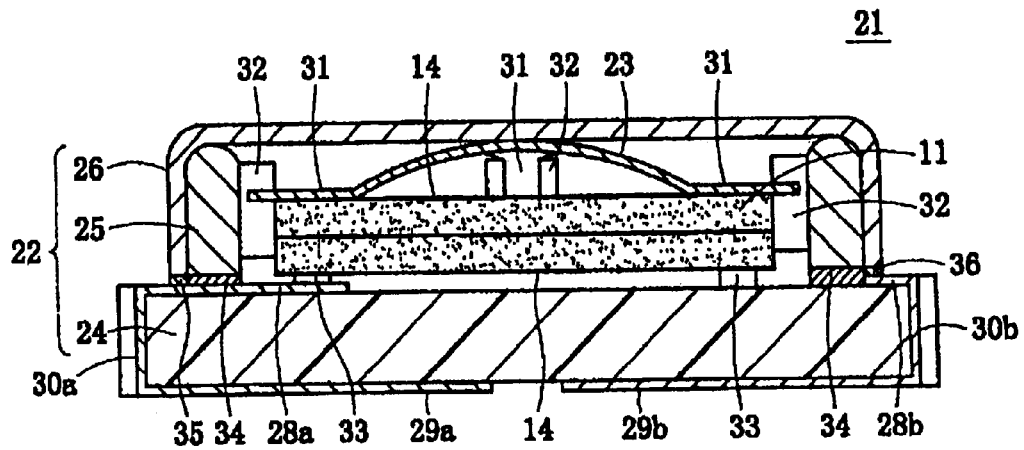
FIG. 3 is a cross-sectional view showing the structure of a piezoelectric component according to another preferred embodiment of the present invention.
Figure 4A:
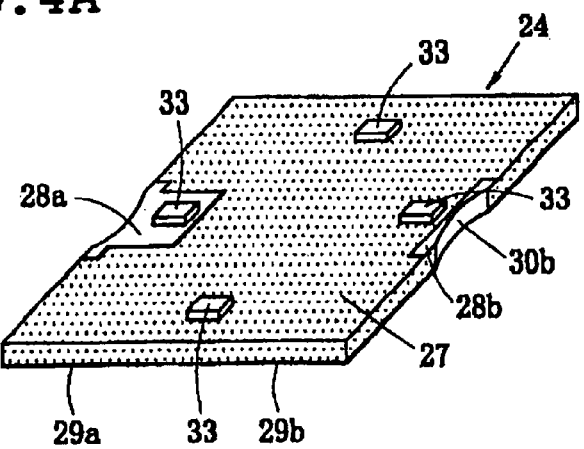
FIGS. 4A and 4B are perspective views of a case base-sheet in the other preferred embodiment, viewed from the front surface and the back surface, respectively.
Figure 4B:
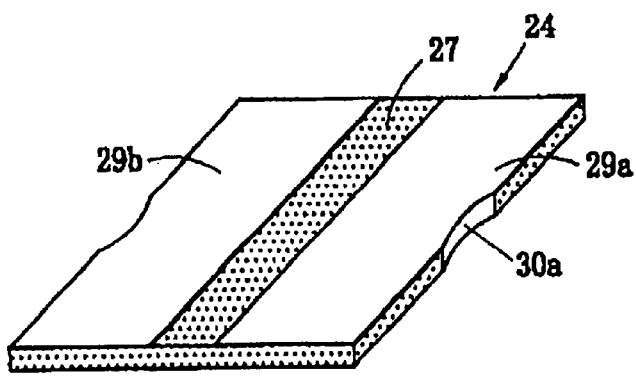
Figure 5:
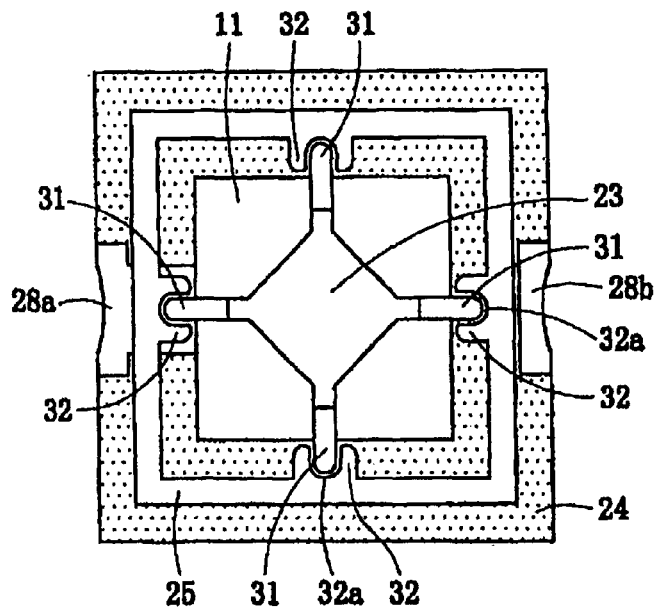
FIG. 5 is a plan view showing the state that a bending resonator and a metallic spring terminal are placed in an inner case in one of the preferred embodiments of the present invention.

FIG. 3 is a cross-sectional view of a piezoelectric component 21 according to another preferred embodiment of the present invention. A surface mount component is constructed by placing the above-described bending resonator 11 and a metallic spring terminal 23 into a case 22. The case 22 preferably includes a case base-sheet 24, an inner case 25, and an electro-conductive cap 26. The case base-sheet 24 is preferably constructed by forming electrodes on a base-sheet body 27 such as a resin sheet, a glass epoxy resin base sheet, a ceramic base sheet, or other such sheet, as shown in FIGS. 4A and 4B. Internal connection electrodes 28a and 28b which are large and small are provided on opposite end portions of the upper surface of the base-sheet body 27. External electrodes defining external terminals 29a and 29b are disposed on opposite end portions of the lower surface thereof. The internal connection electrodes 28a, 28b are connected to the external electrodes 29a, 29b, respectively, through through-hole split electrodes 30a, 30b (formed by splitting a through-hole into two parts) provided in concave portions which are provided in the opposite end a portions of the base-sheet body 27. The metallic spring terminal 23 has four legs 31 and has a substantially cross shape, as shown in FIG. 5. The legs 31 each are bent into an arc shape excluding the top portion thereof. The inner case 25 is a resin molding product (e.g., injection molding product) having an angular frame shape, and is slightly thinner than the overall thickness of the bending resonator 11 and the metallic spring terminal 23. Positioning portions 32 are provided in the approximate centers of the inner walls of the respective sides of the inner case 25, respectively. Grooves 32a elongating vertically are provided in the positioning portions 32, so that the positioning portions 32 are forked, respectively. The distance between the opposed positioning portions 32 is nearly equal to the length $L_B$ of one side of the bending resonator 11. The electroconductive cap 26 is made of a conductive metal material such as aluminum, copper, or the like, and the height of the inner space thereof is nearly equal to the thickness of the inner case 25.

When the piezoelectric component 21 is assembled, a first plurality of supporting members, preferably in the form of protuberances, 33 are disposed on the case base-sheet 24 so as to have the same height, as shown in FIG. 4A. The supporting members 33 are arranged in such a manner that they can support the bending resonator 11 at the nodes 15 thereof. At least one of the supporting members 33 is provided on the large internal connection electrode 28a. The one of the supporting members 33 disposed on the internal connection electrode 28a is made from an electroconductive material such as an electroconductive paste, and the other supporting members 33 are not limited to any particular material. For simplification of the process, all the supporting members 33 are preferably made from the same material (electroconductive material). In this case, it is preferable that the supporting members 33 are insulated from the small inner connection electrode 28b.

Subsequently, the inner case 25 is laid on the case base-sheet 24, and the lower surface of the inner case 25 is bonded to the upper side of the case base-sheet 24 by an insulation adhesive 34. Like this, the case body is constructed by bonding the inner case 25 to the case base-sheet 24. The supporting members 33 are positioned in the inner periphery of the inner case 25. When the bending resonator 11 is placed in the inner case 25, the resonator 11 is supported in the vicinities of the nodes on the lower surface thereof by the supporting members 33, whereby spaces for vibration are defined between the bending resonator 11 and the case base-sheet 24. Further, the bending resonator 11 is held at four positions in the peripheral side thereof in the vicinities of the nodes 15 by the positioning portions 32, as shown in FIG. 5. Thereby, positional slipping and rotating of the bending resonator 11 is prevented. In addition, the vibration damping is prevented, which may be caused by the fact that any position excluding the nodes and their vicinities in the positioning portions 32 is brought into contact with the inner case 25.

The metallic spring terminal 23 is placed into the inner case 25 from the upper side of the bending resonator 11, and the legs 31 of the metallic spring terminal 23 are inserted into the grooves 32a of the positioning portions 32, respectively, as shown in FIG. 5. Thereby, the metallic spring terminal 23 is also positioned by the positioning portions 32. The base portions of the legs 31 of the metallic spring terminal 23 are brought into contact with the vicinities of the nodes 15 on the upper side of the bending resonator 11. The approximate center portion of the metallic spring terminal 23 is separated from the upper surface of the bending resonator 11 so as not to hinder the bending vibration of the bending resonator 11.

Subsequently, the electroconductive cap 26 is arranged to cover the case base-sheet 24, so as to cover the outer periphery of the inner case 25, and all of the lower surface of the electro-conductive cap 26 is arranged to adhere to the case base-sheet 24. Here, regarding an adhesive for bonding the lower surface of the electro-conductive cap 26, an adhesive 35 having insulation properties is arranged at least over the large internal connection electrode 28a, while an adhesive 36 having conductive properties is arranged at least over the small internal connection electrode 28b. Thus, the electro-conductive cap 26 is insulated from the inner connection electrode 28a, but is electrically connected to the inner connection electrode 28b.

When the electro-conductive cap 26 is arranged to cover as described above, the metallic spring terminal 23 is pressed by the electro-conductive cap 26, and the nodes 15 at the four positions of the bending resonator 11 are elastically sandwiched and held between the legs 31 of the metallic spring terminals 23 and the supporting members 33, due to the elasticity of the metallic spring terminal 23.

In the piezoelectric component 21 assembled as described above, the surface electrode 14 on the lower surface of the bending resonator 11 is electrically connected to the external electrode 29a on the lower surface via the conductive supporting members 33, the internal connection electrode 28a, and the through-hole split electrode 30a. The surface electrode 14 on the upper surface of the bending resonator 11 is electrically connected to the external electrode 29b on the lower surface via the metallic spring terminal 23, the electro-conductive cap 26, the internal connection electrode 28b, and the through-hole split electrode 30b.

Accordingly, the piezoelectric component 21, can be used as a surface mount device, since both the external electrodes 29a and 29b are provided on the lower surface of the case base-sheet 24. Further, the bending resonator 11 provided in the component 21 can be further decreased in size as compared with the conventional radial resonator 1 while the same resonant frequencies are used. Moreover, the piezoelectric component 21 can be made much thinner, achieved by the above-described case structure. Accordingly, a small, thin device can be produced by use of the piezoelectric component 21.

More specifically, a piezoelectric component using the 400 kHz radial resonator 1 (for example, one having the case structure as disclosed in Japanese Unexamined Utility Model Publication No. 60-119130) and one using the bending resonator 11 will be compared, giving the following TABLE 2. The piezoelectric component using the bending vibrator can be downsized and thinned, that is, the width and the length can be reduced to about 1/2.3 to about 1/2.6 times, respectively, the thickness to about 1/1.8 times, and the volume to about 1/11 times.

TABLE 2

|  | Width | length | thickness | volume |
| --- | --- | --- | --- | --- |
| radial resonator | 8.0 | 9.0 | 3.3 | 237.6 |
| bending resonator | 3.5 | 3.5 | 1.8 | 22.0 |

(resonant frequency fr = 400 kHz)

In this preferred embodiment, the case body preferably includes the case base-sheet 24 and the inner case 25 which are separated from each other. The case base-sheet 24 and the inner case 25 may have an integrated structure. If the case body has an integrated structure, the number of parts can be reduced. In the case where the case base-sheet 24 and the inner case 25 are separated as in this preferred embodiment, the internal connection electrodes 28a and 28b, the external electrodes 29a and 29b, and other elements can be easily formed by use of the base-sheet body 27 such as a resin sheet, a glass epoxy base sheet, a ceramic base sheet, or other suitable sheet.

Further, the external electrodes 29a and 29b can be constructed so as to be flat by providing a metal foil pattern, a conductor thin film (vapor deposition film or the like), or a conductor thick film (a baked film made from a conductive paste) on the lower surface of the case base-sheet 24. Accordingly, this piezoelectric component can be stably mounted onto a printed wiring board or other substrate, and can be used as a component suitable for surface mounting.

Further, as described above, for assemblage of the piezoelectric component 21, the case base-sheet 24, the inner case 25, the bending resonator 11, the metallic spring terminal 23, and the electro-conductive cap 26 are mounted sequentially in the order from the lowermost position. Thus, the piezoelectric component 21 can be easily produced. The production process is greatly simplified, and is suitable especially for automatic assemblage.

The conductive cap 26 may be produced by forming a resin, a ceramic, or other suitable material, and forming an electro-conductive film, e.g., by plating or other suitable process, only on the inner wall and the lower surface.

Further, supporting members may be provided on the lower surface of the electro-conductive cap 26 and press the nodes 15 or their vicinities of the bending resonator 11, and the metallic spring terminal 23 may be sandwiched and held between the case base-sheet 24 and the bending resonator 11, though shown.

Figure 6:
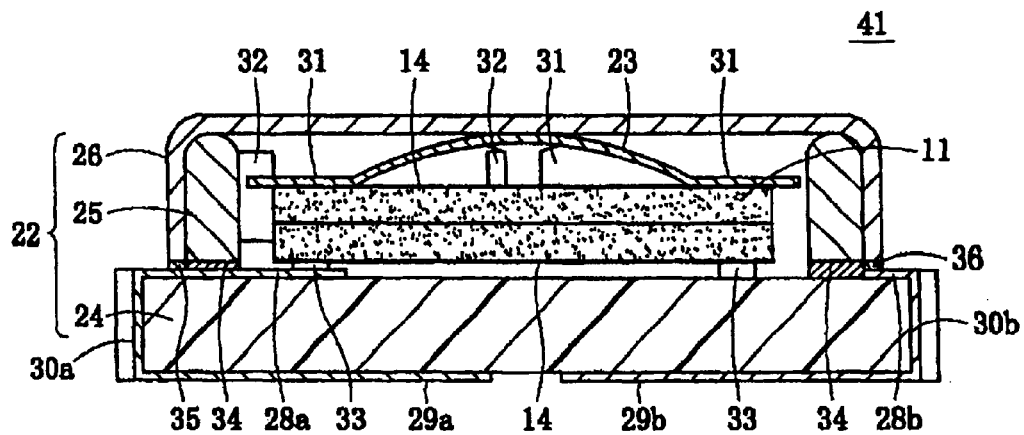
FIG. 6 is a cross-sectional view showing the structure of a piezoelectric component according to still another preferred embodiment of the present invention.
Figure 7:
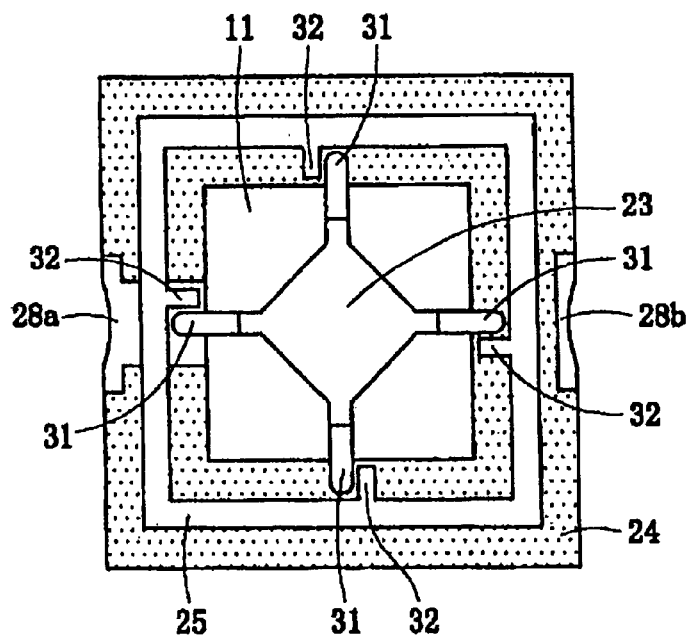
FIG. 7 is a plan view showing how a bending resonator and a metallic spring terminal are placed in an inner case in the further preferred embodiment.

FIG. 6 is a cross-sectional view showing the structure of a piezoelectric component 41 according to a further preferred embodiment of the present invention. FIG. 7 is a plan view showing the piezoelectric component 41 before the electro-conductive cap 26 is attached. In this preferred embodiment, the structure of positioning portions 32 are simplified. In the preferred embodiment of FIG. 3, the legs 31 of the metallic spring terminal 23 are inserted into the grooves 32a of the forked positioning portions 32, so that the legs 31 are sandwiched in the positioning portions 32, respectively. On the other hand, in this preferred embodiment, the positioning portions 32 are contacted with only one-side surfaces of the metallic spring terminal 23. In order to prevent the metallic spring terminal 23 from rotating in either direction, two of the four positioning portions 32 are arranged to contact the right-hand side surfaces of the legs 31, while the remaining two are arranged to contact the left-hand side surfaces of the legs 31.

In this preferred embodiment, the structure of the positioning portions 32 is greatly simplified. Accordingly, the structure of a mold for forming an inner case 25 can be simplified, and the cost can be greatly reduced. In addition, the work required to insert the metallic spring terminal 23 into the inner case 25 automatically can be also simplified, and the required insertion precision may be reduced.

Figure 8:
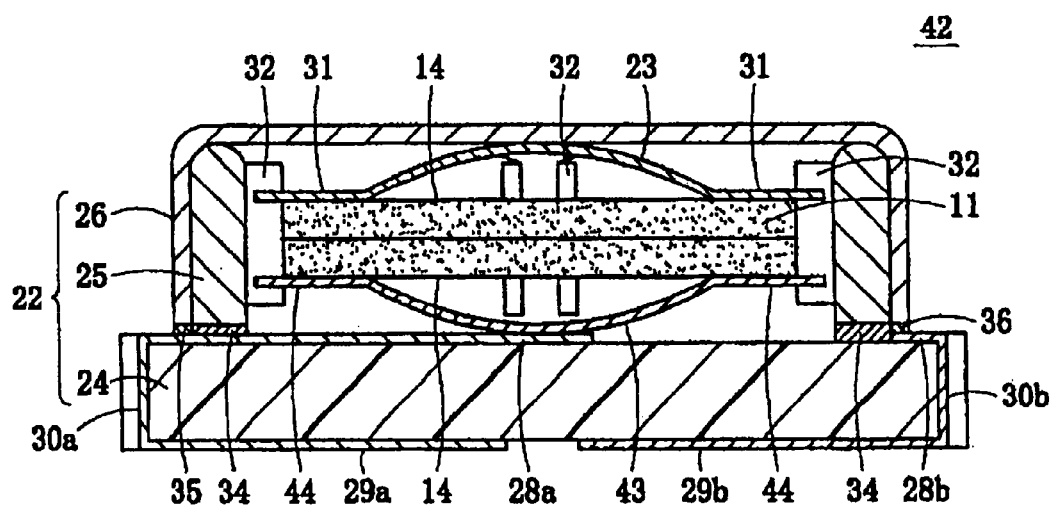
FIG. 8 is a cross-sectional view showing the structure of a piezoelectric component according to yet another preferred embodiment of the present invention.

FIG. 8 is a cross-sectional view showing the structure of a piezoelectric component 42 according to still another preferred embodiment of the present invention. In this preferred embodiment, a metallic spring terminal 43 is used instead of the supporting members 33 in the piezoelectric component 21 of the preferred embodiment of FIG. 3. That is, the metallic spring terminal 43 having the same structure as a metallic spring terminal 23 on the upper surface is placed on the lower surface of the bending resonator 11 so as to be inverted with respect to the metallic spring terminal 23 on the upper surface. From the front and back surfaces, the nodes 15 and their vicinities are sandwiched between the metallic spring terminals 23 and 43 on the upper and lower surfaces. Further, the legs 44 of acting terminal 43 on the lower surface are inserted into the grooves 32a of positioning portions 32 as well as the legs 31 of the metallic spring terminal 23 on the upper surface. However, for an internal connection electrode 28a, it is preferably elongated to extend to the approximate center portion of a case base-sheet 24 so as to be electrically connected to the metallic spring terminal 43.

Figure 9:
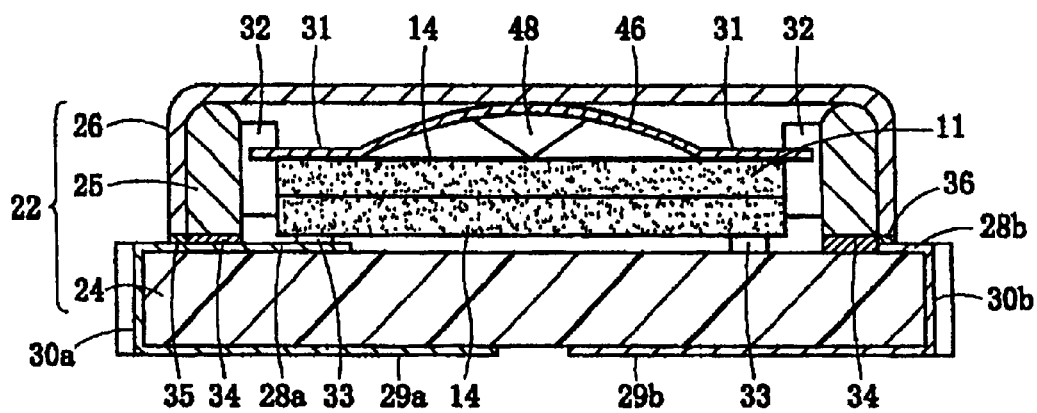
FIG. 9 is a cross-sectional view showing the structure of a piezoelectric component according to a further preferred embodiment of the present invention.
Figure 10:
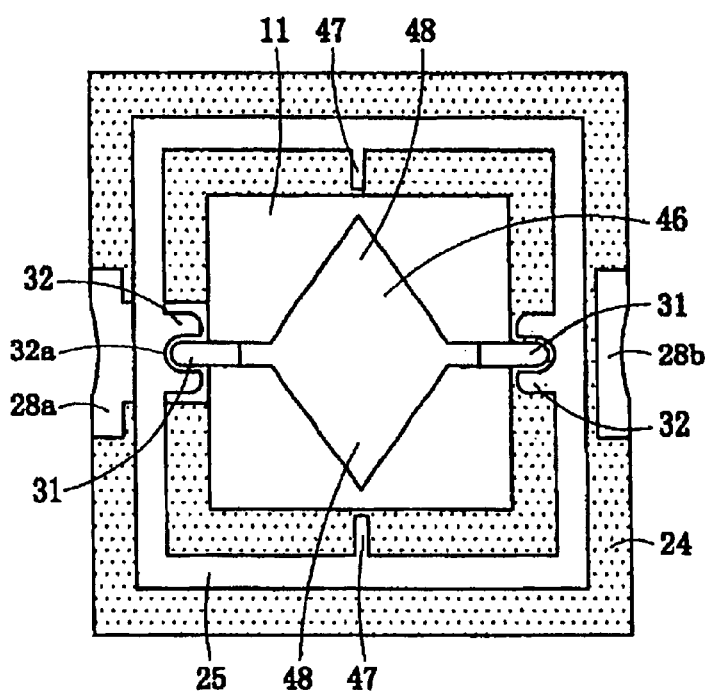
FIG. 10 is a plan view showing how a bending resonator and a metallic spring terminal are placed in an inner case in the further preferred embodiment of FIG. 9.
Figure 11:
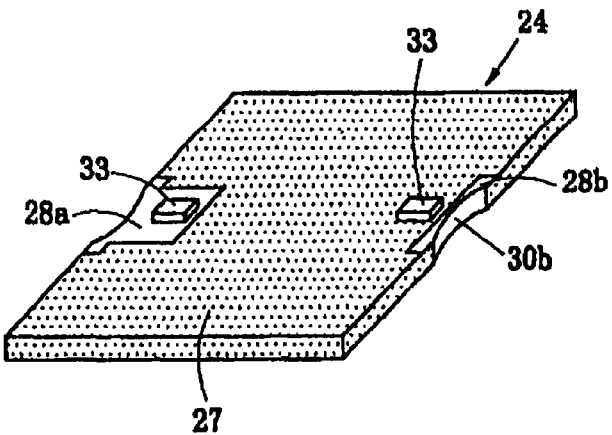
FIG. 11 is a perspective view showing supporting members disposed on a base sheet in the further preferred embodiment.

FIG. 9 is a cross-sectional view showing the structure of a piezoelectric component 45 according to yet another preferred embodiment of the present invention. FIG. 10 is a plan view showing the state of the piezoelectric component 45 before it is covered with an electro-conductive cap 26. In the piezoelectric component 45, the number of the legs 31 of a metallic spring terminal 46 is preferably two. Corresponding to this, the inner peripheral surface of an inner case 25 is provided with a pair of forked positioning portions 32 having grooves 32a for holding the legs 31 of the metallic spring terminal 46, respectively, and a pair of positioning portions 47 protruding toward the nodes 15 of a bending resonator 11. As shown in FIG. 11, supporting members 33 are disposed only at two positions on the upper-surface of a case base-sheet 24, corresponding to the legs 31 of the metallic spring terminal 46.

The bending resonator 11 is placed in the inner case 25 and mounted on the supporting members 33. The metallic spring terminal 46 is placed onto the bending resonator 11 in the inner case 25, and the legs 31 are inserted into the grooves 32a of the positioning portions 32. Accordingly, the bending resonator 11 is positioned with the positioning portions 32 and 47 arranged to contact the nodes 45 and the vicinities of the nodes. The metallic spring terminal 46 is positioned by the grooves 32a of the positioning portions 32. The nodes 15 at two positions of the bending resonator 11 are pressed by the base portions of the legs 31, respectively. Further, the nodes 15 at the remaining two positions are pressed by the tips of the extended portions 48 of the metallic spring terminal 46 extended in the direction that is substantially perpendicular to the legs 31 thereof.

Preferably, the areas of the portions of the bending resonator 11 which press the nodes 15 are as small as possible. The reason lies in that the exact mathematically-determined nodes 15 are points, and even if the pressing-positions of the metallic spring terminal 46 depart from the nodes 15, caused by positional slipping at assemblage, the bending resonator 11 is pressed at positions excluding the nodes 15, so that damping of the vibration is prevented.

In this preferred embodiment, the legs 31 at the two positions of the metallic spring terminal 46 are positioned by the positioning portions 32. The four nodes 15 of the bending resonator 11 are pressed by the metallic spring terminal 46. However, the extended portions 48 of the metallic spring terminal 46 my be omitted, and only the nodes 15 at the two position of the bending resonator 11 may be pressed by the two legs 31 of the metallic spring terminal 46.

Figure 12:
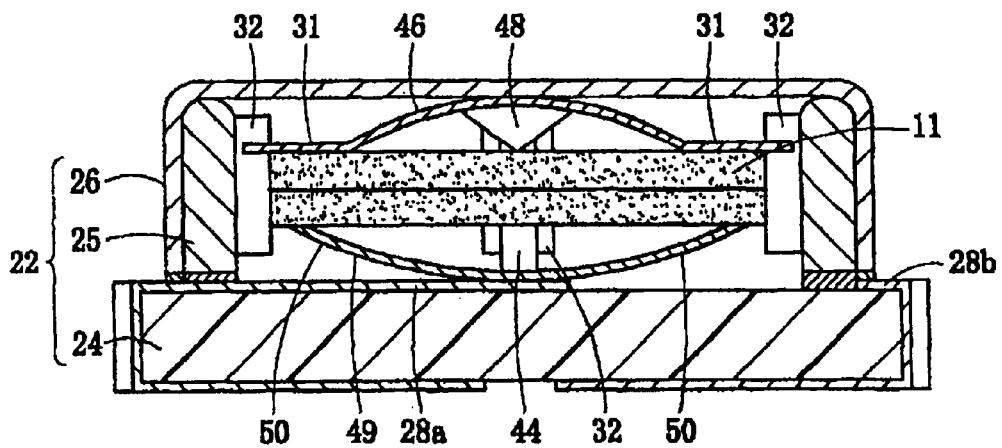
FIG. 12 is a cross-sectional view showing the structure of a piezoelectric component according to a still further preferred embodiment of the present invention.
Figure 13:
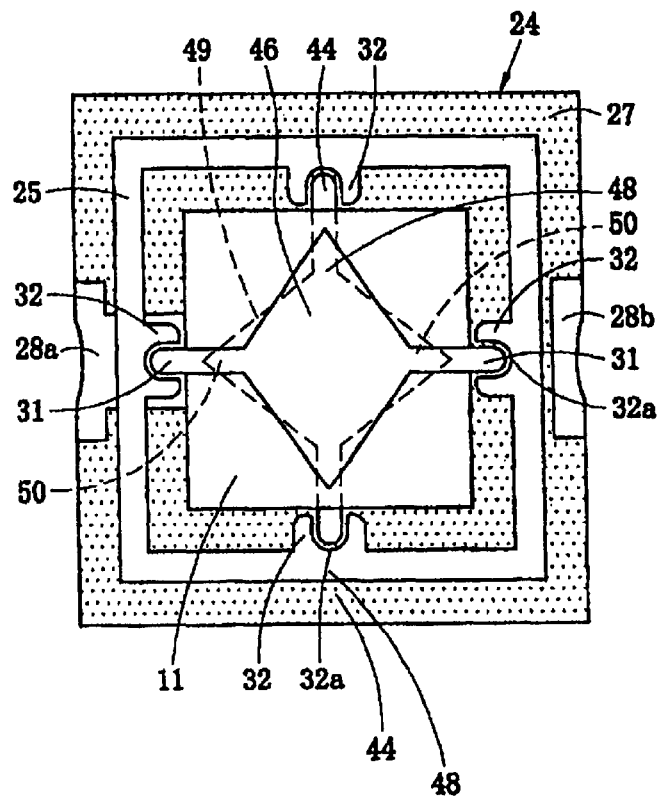
FIG. 13 is a plan view showing how a bending resonator and a metallic spring terminal are placed in an inner case in the further preferred embodiment.

As a modification of the preferred embodiment shown in FIG. 9, the upper surface and the lower surface of a bending resonator 11 may be pressed by metallic spring terminals 46, 49 each having two legs 31, 44, as shown in FIGS. 12 and 13. The metallic spring terminal 49 on the lower surface, as well as the metallic spring terminal 46 on the upper surface, has two legs 44 and extended portions 50. Each positioning portion 32 of an inner case 25 preferably has a forked shape having a groove 32a. The legs 31 of the metallic spring terminal 46 on the upper surface and the legs 44 of the metallic spring terminal 49 on the lower surface are arranged on the upper surface and the lower surface of the bending resonator 11, at an angle of about 90° relative to each other, respectively.

According to these preferred embodiments, the metallic spring terminals 46, 49 have only two legs 31, 44, respectively, the structures of the metallic spring terminals 46, 49 can be simplified, and also can be easily incorporated into the inner case 25.

Figure 14:
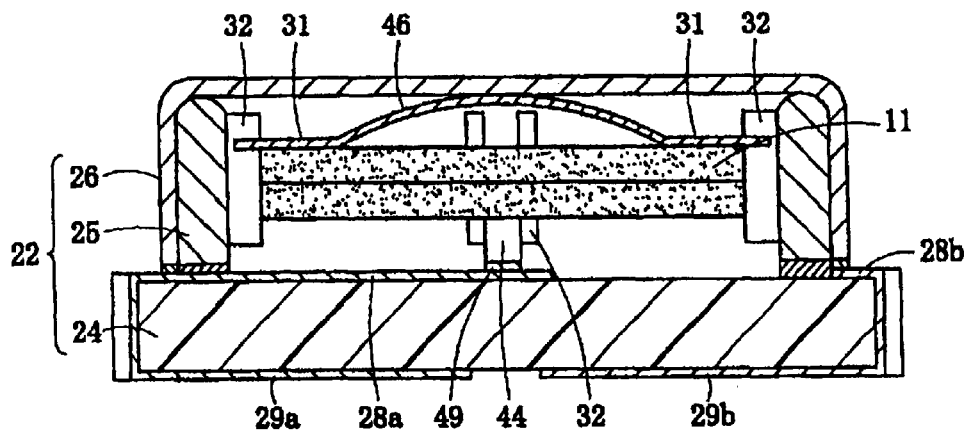
FIG. 14 is a cross-sectional view showing the structure of a piezoelectric component according to another preferred embodiment of the present invention.
Figure 15:
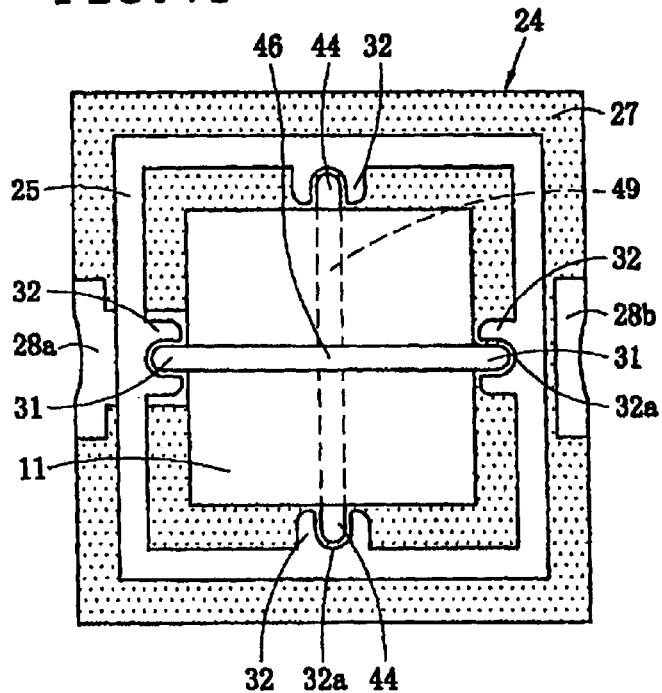
FIG. 15 is a plan view showing how a bending resonator and a metallic spring terminal are placed in an inner case in the additional preferred embodiment.

In the preferred embodiments, the legs 31, 44 at the two positions of the metallic spring terminals 46, 49 are positioned by the positioning portions 32, respectively, and the four nodes 15 of the bending resonator 11 are pressed by the metallic spring terminals 46, 49, respectively. However, the extended portions 48, 50 of the metallic spring terminals 46, 49 may be omitted. That is, as shown in FIGS. 14 and 15, the nodes 15 at the two positions of the metallic spring terminal 46 and the nodes 15 at the other two positions thereof may be pressed by only the two legs 31 of the metallic spring terminal 46 on the front surface of the bending resonator 11 and by only the two legs 44 of the metallic terminal 49 on the back surface and crossed with the two legs 31, respectively. According to this preferred embodiment, vibration damping of the bending resonator 11 is even further reduced.

Figure 16:
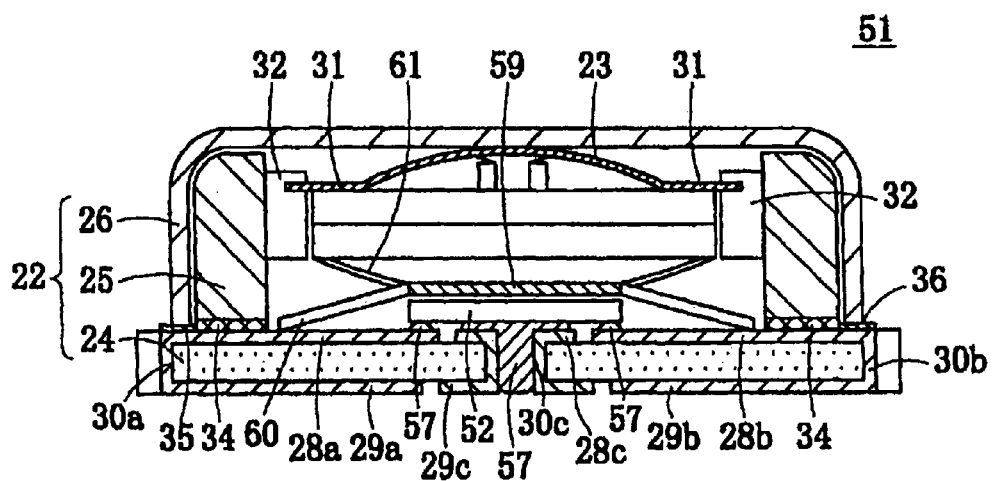
FIG. 16 is a cross-sectional view showing the structure of a piezoelectric component according to still another preferred embodiment of the present invention.
Figure 17:
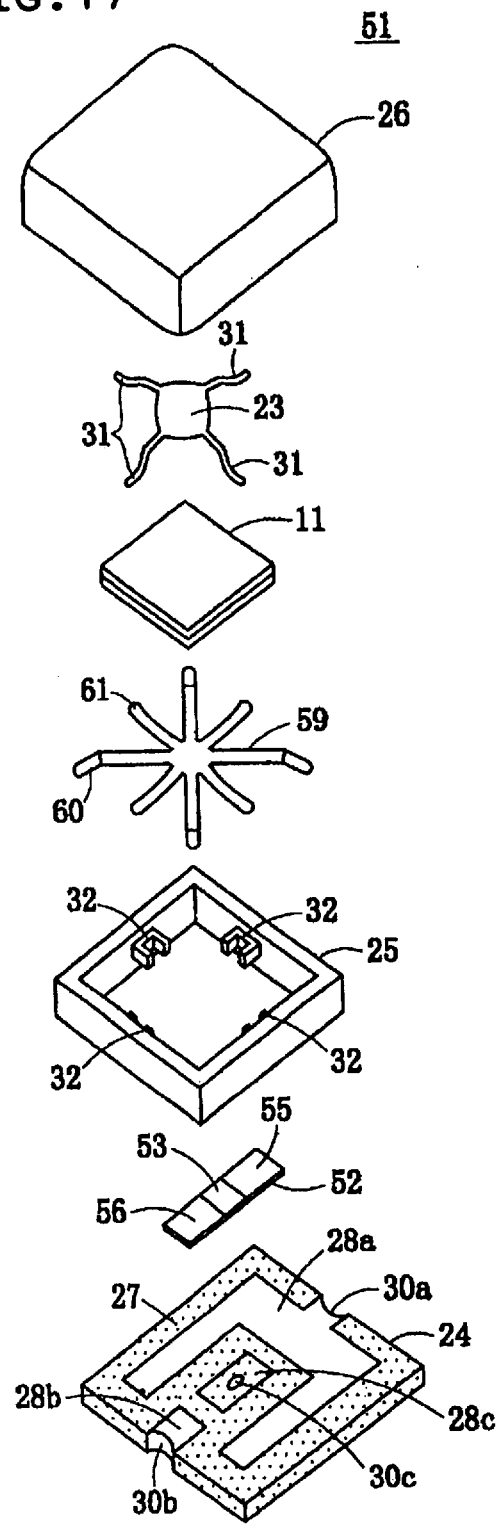
FIG. 17 is an exploded perspective view of the piezoelectric component of the other preferred embodiment.

FIG. 16 is a cross-sectional view showing the structure of a piezoelectric component 51 according to a further preferred embodiment of the present invention. FIG. 17 is an exploded perspective view of the piezoelectric component 51. The piezoelectric component 51 contains a load capacity element (capacitor) 52 together with the bending resonator 11 in a case 22.

Figure 18:
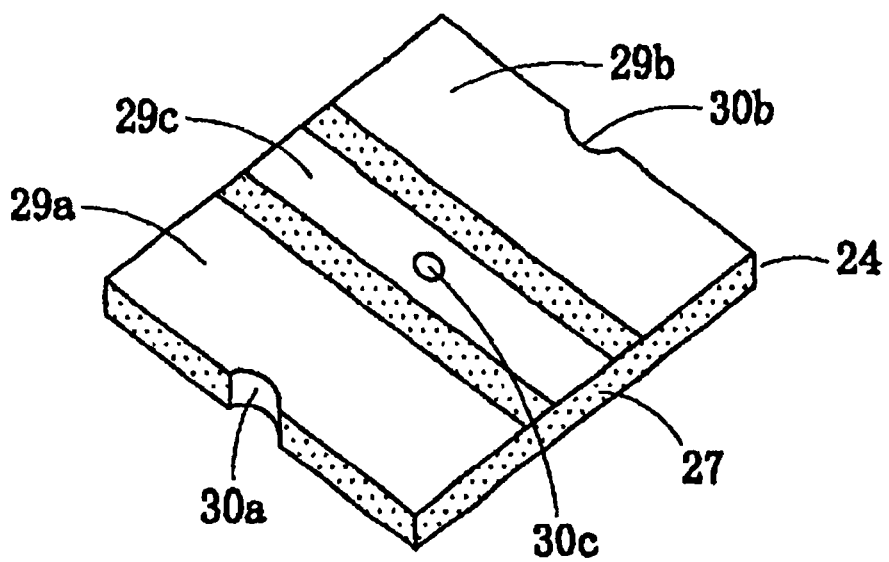
FIG. 18 is a perspective view showing the lower side of a case base-sheet in the other preferred embodiment.

In a case base-sheet 24 used in the piezoelectric component 51, three-range internal connection electrodes 28a, 28b, and 28c are disposed on the upper surface of a base-sheet body 27, and three external electrodes 29a, 29b, and 29c are disposed on the back surface, as shown in FIG. 18. The internal connection electrode 28b in the one end portion and the external electrode 29b are connected to each other through a through-hole split electrode 30b. The internal connection electrode 28a in the outer peripheral portion and the external electrode 29a are connected to each other through a through-hole split electrode 30a. Further, the internal connection electrode 28c in the approximate center and the external electrode 29c are connected to each other via the through-hole 30c.

Figure 19:
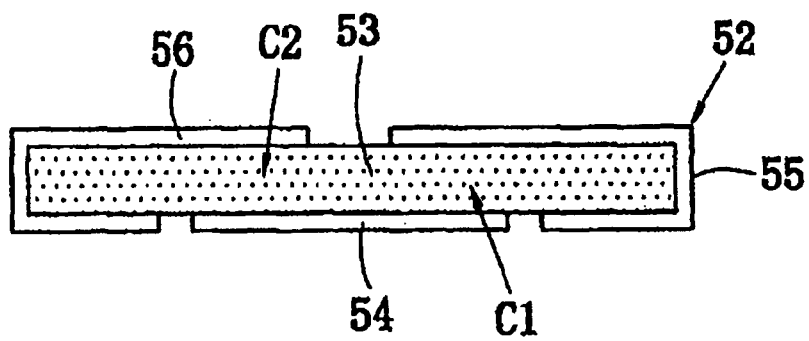
FIG. 19 is a front view of a load capacitance element in the other preferred embodiment.

The load capacitance element 52 used in this preferred embodiment is of the same type as often used in MHz band oscillators, and preferably includes two load capacities C1 and C2 integrated with each other as shown in FIG. 19. That is, in the load capacitance element 52, a common electrode (ground electrode) 54 is provided in the approximate center of the lower surface of a piezoelectric substrate 53, and capacitance electrodes 55 and 56 are provided on the opposite end portions of the piezoelectric substrate 53 so as to extend from the lower surface to the upper surface. One load capacitance C1 is produced between the capacitance electrode 55 and the common electrode 54, and the other load capacitance C2 is produced between the capacitance electrode 56 and the common electrode 54. Both the load capacitance C1 and C2 are connected in series through the common electrode 54.

Figure 20A:
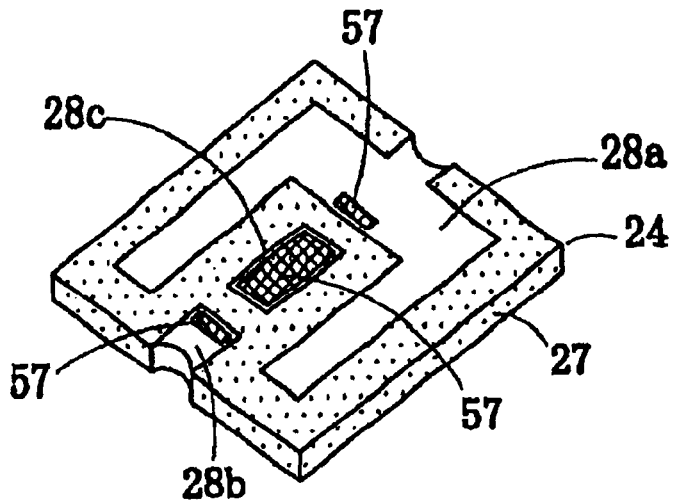
FIGS. 20A and 20B are perspective views each showing the process in which the load capacitance element is mounted onto a case base-sheet in the further preferred embodiment.
Figure 20B:
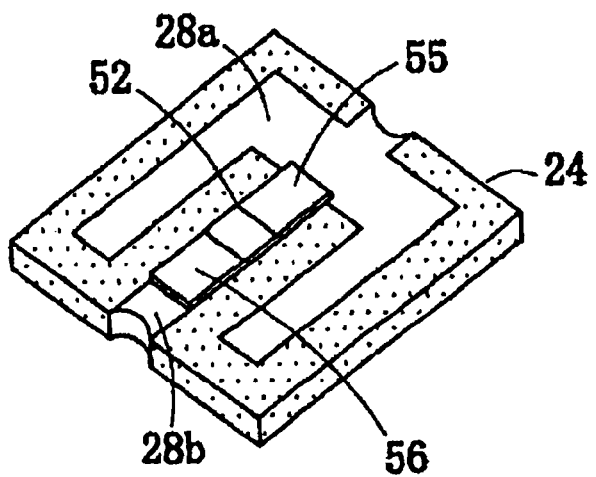

The load capacitance element 52 is mounted onto the case base-sheet 24 in the state shown in FIG. 20B before the inner case 25 and so forth are attached onto the case base-sheet 24. That is, as shown in FIG. 20A, an electro-conductive adhesive 57 is coated onto the respective internal connection electrodes 28a, 28b, and 28c, and simultaneously, is filled into the through-hole 30c. The load capacitance element 52 is placed thereon and pressed, and the electro-conductive adhesive 57 is hardened. As a result, the load capacitance element 52 is fixed to the upper surface of the case base-sheet 24 by the electro-conductive adhesive 57, and simultaneously, the capacitance electrodes 55 and 56 positioned on the opposite end portions are electrically connected to the internal connection electrodes 28a and 28b, respectively, while the common electrode 54 is electrically connected to the internal connection electrode 28c. Accordingly, the common electrode 54 of the load capacitance element 52 is electrically connected to the external electrode 29c in the approximate center of the lower surface of the case base-sheet 24 via the through-hole 30c.

Next, an insulation adhesive 34 is coated onto the lower surface of the inner case 25, and the inner case 25 is arranged to adhere to the peripheral portion in the upper surface of the case base-sheet 24. After the insulation adhesive 34 is hardened, a metallic spring terminal 59 is placed into the inner case 25.

Figure 1:
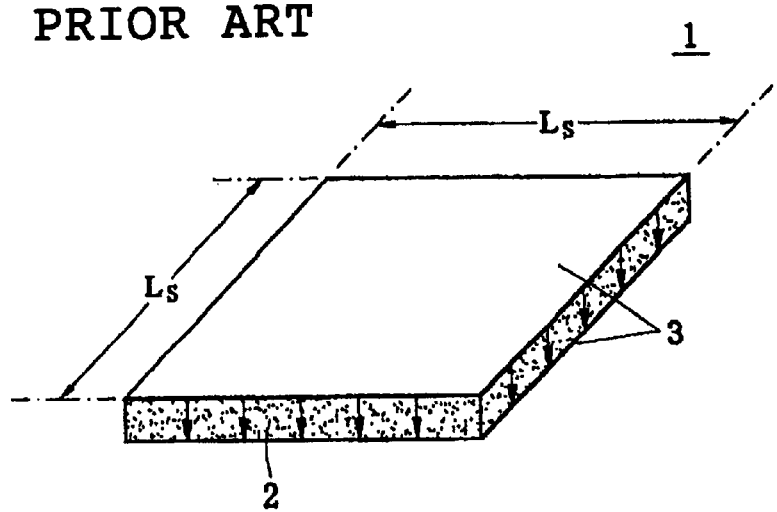
FIG. 1 is a perspective view showing a conventional piezoelectric resonator using radial vibration.
Figure 21A:
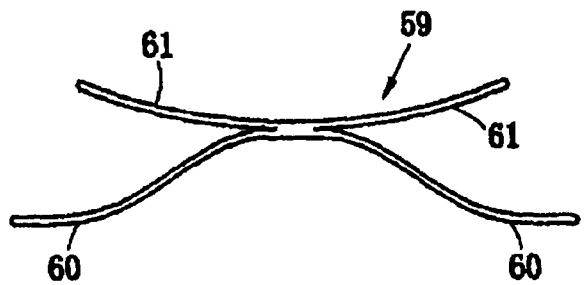
FIG. 21A is a front view showing the structure of a metallic spring terminal beneath a bending resonator.
Figure 21B:
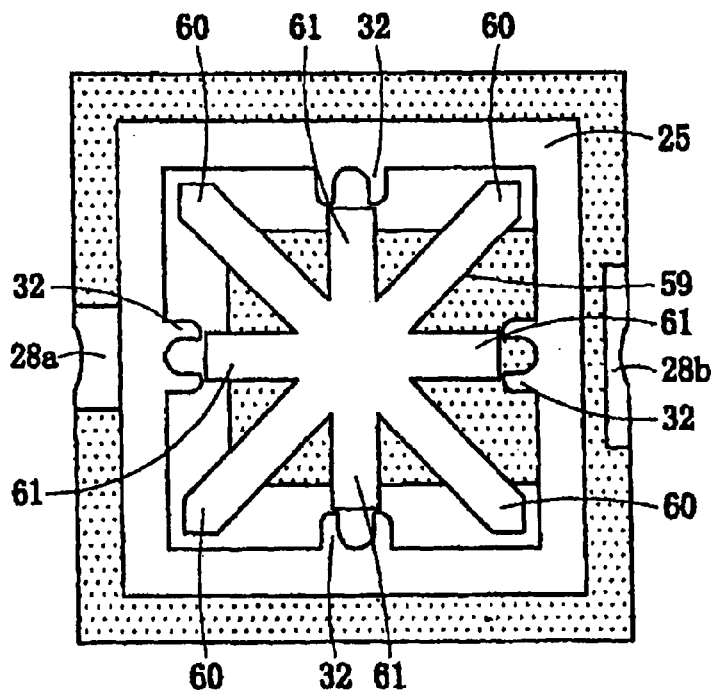
FIG. 21B is a plan view showing how the metallic spring terminal is placed in the inner case.

The metallic spring terminal 59 preferably has four downward-directed legs 60 elongated radially, and four upward-directed legs 61 elongated from the middle portion between the downward-directed legs 60, slightly toward the upper surface, as shown in FIG. 21A. Any of the downward-directed legs 60 of the metallic spring terminal 59 is bent downwardly so as to provide an elastic force. The distance between the tips of the downward-directed legs 60 positioned in the diagonal direction is substantially equal to the diagonal distance of the space in the inner case 25. Accordingly, as shown in FIG. 21B, the metallic spring terminal 59 is placed into the inner case 25 as shown in FIG. 1B. The metallic spring terminal 59 can be placed into the inner case 25, not interfering with positioning portions 32, and the tips of the respective downward-directed legs 60 of the metallic spring terminal 59 are positioned at the corners in the inner periphery of the inner case 25, respectively. The internal connection electrode 28a is positioned in the corner, so that the metallic spring terminal 59 is electrically connected to the internal connection electrode 28a of the case base-sheet 24.

As described above, the metallic spring terminal 59 is separated from the upper surface of the case base-sheet 24 except for the tips of the downward-directed legs 60, so that a space is defined between the case base-sheet 24 and the metallic spring terminal 59. Thus, the load capacitance element 52 is mounted onto the case base-sheet 24 using this space. Further, a gap is provided between the load capacitance element 52 and the metallic spring terminal 59 so that the insulation between the load capacitance element 52 and the metallic spring terminal 59 is maintained.

When the bending resonator 11 is placed into the inner case 25, the upward-directed legs 61 of the metallic spring terminal 59 are brought into contact with the approximate center portions or nodes 15 of the sides of the lower surface of the bending resonator 11 to support the bending resonator 11, respectively. Further, the positioning portions 32 of the inner case 25 are brought into contact with or near to the nodes 15 to position the bending resonator 11, respectively. After the bending resonator 11 is placed into the inner case 25, the metallic spring terminal 23 is disposed in the inner case 25, the legs 31 of the metallic spring terminal 23 are inserted into the positioning portions 32, and simultaneously, the nodes 15 on the upper surface of the bending resonator 11 are pressed by the legs 31.

After the metallic spring terminal 59, the bending resonator 11, and the metallic spring terminal 23 are placed in the inner case, an insulation adhesive 35 is coated onto the lower surface of an electro-conductive cap 26, and the electro-conductive cap 26 is arranged to cover the case base-sheet 24 so as to cover the outer periphery of the inner case 25. The insulation adhesive 35 is hardened with the electro-conductive cap 26 being pressed against the case base-sheet 24, so that the electro-conductive cap 26 is bonded to the case base-sheet 24 by the insulation adhesive 35. Thus, the bending resonator 11 and the metallic spring terminals 23 and 59 are sealed between the case base-sheet 24 and the electro-conductive cap 26. Since the internal connection electrode 28b is provided in the position where the electro-conductive cap 26 is bonded, the electro-conductive cap 26 is electrically contacted with the internal connection electrode 28b by an electro-conductive adhesive 36 used instead of the insulation adhesive 35. The gap between the electro-conductive cap 26 and the case base-sheet 24 is sealed with the insulation adhesive 35 and the electro-conductive adhesive 36, and the through-hole 30c is filled with the electro-conductive adhesive 57. Thus, the bending resonator 11 is sealed to be air tight between the electro-conductive cap 26 and the case base-sheet 24.

When the electro-conductive cap 26 is pressed against the case base-sheet 24 to be bonded integrally as described above, the legs 31 of the metallic spring terminal 23 and the upward-directed legs 61 of the metallic spring terminal 59 are pressed against both sides of the bending resonator 11, due to the elasticity of the metallic spring terminal 23. Accordingly, the bending resonator 11 is sandwiched and held at the nodes 15 from both sides thereof, and is electrically connected to the metallic spring terminals 23 and 59 and the electro-conductive cap 26. Since the metallic spring terminal 59 is in contact with the internal connection electrode 28a, the surface electrode 14 on the lower surface of the bending resonator 11 and one capacitance electrode 55 of the load capacitance element 52 are electrically i=connected to the external electrode 29a via the through-hole split electrode 30a. Further, since the electro-conductive cap 26 is electrically connected to the internal connection electrode 28b via the electro-conductive adhesive 36, the surface electrode 14 on the upper surface of the bending resonator 11 and the other capacitance electrode 56 of the load capacitance element 52 are electrically connected to the external electrode 29b via the through-hole split electrode 30b.

Figure 22:
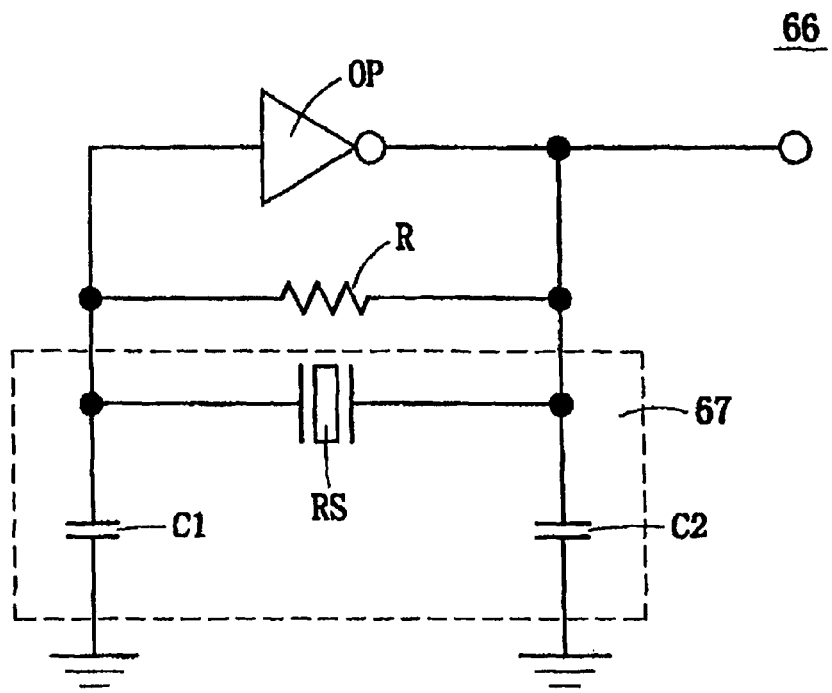
FIG. 22 illustrates an oscillation circuit diagram.

FIG. 22 shows an oscillation circuit 66 in which an inverting amplifier OP, a bias resistor R, and a piezoelectric resonator RS are connected in parallel. The input terminal of the inverting amplifier OP is grounded via a load capacitance C1, and moreover, the output terminal of the inverting amplifier OP is grounded via a load capacitance C2. Regarding an oscillation circuit 66 of this type, a piezoelectric oscillator 67 (the portion enclosed by the broken line in FIG. 22) is arranged such that the load capacitances C1 and C2 are connected to both ends of the piezoelectric resonator RS, respectively, and so that the piezoelectric resonator RS and the load capacitances C1 and C2 are integrated with each other. In the piezoelectric component 51 having the structure as described above, the piezoelectric resonator 67, which is the portion enclosed by the broken line, of the oscillation circuit 66 shown in FIG. 22 can be integrally produced.

Figure 23:
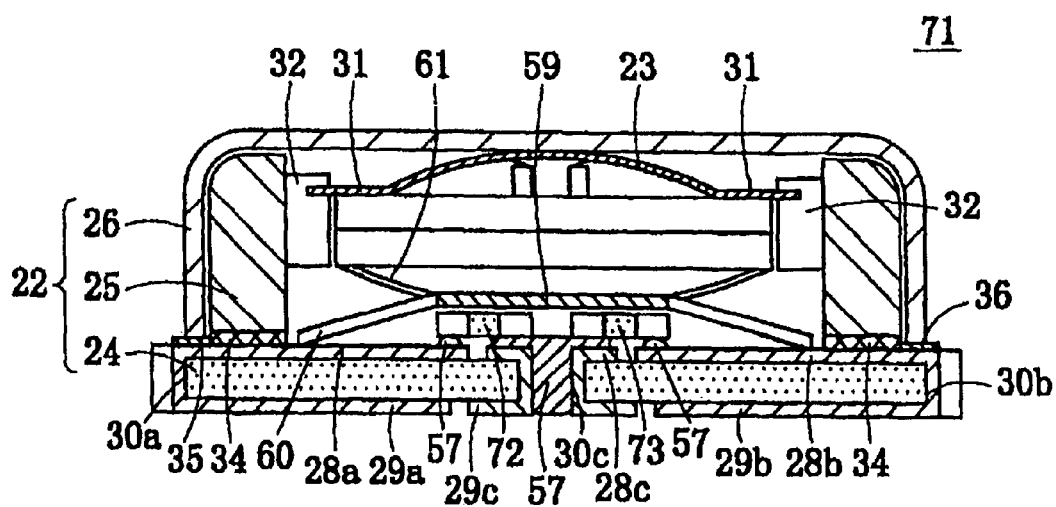
FIG. 23 is a cross-sectional view showing the structure of a piezoelectric component according to yet another preferred embodiment of the present invention.

FIG. 23 is a cross-sectional view showing the structure of a piezoelectric component 71 according to a still further preferred embodiment of the present invention. In this preferred embodiment, two load capacitance elements (monolithic capacitors) 72 and 73 are mounted on a case base-sheet 24. The ninth preferred embodiment is preferably the same as the eighth preferred embodiment except for the load capacitance elements 72 and 73.

Figure 24:
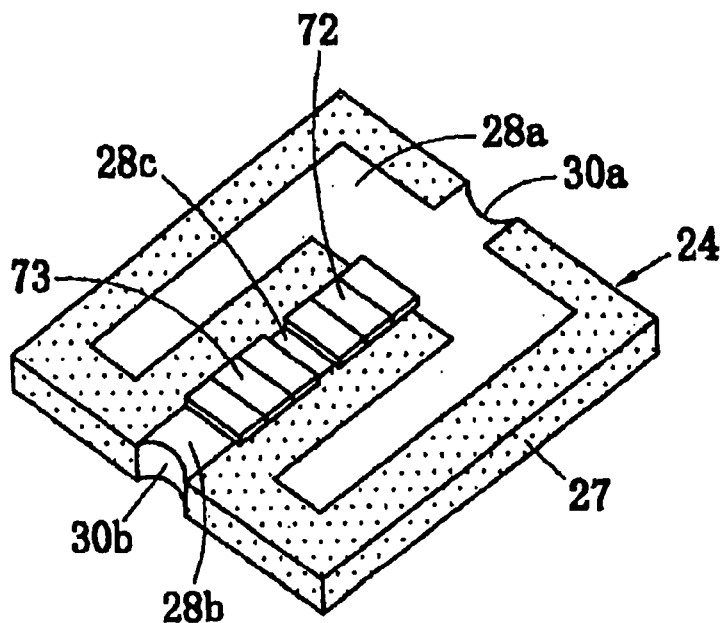
FIG. 24 is a perspective view showing the state that two load capacitance elements are mounted onto a case base-sheet in the yet another preferred embodiment.

In the eighth preferred embodiment, the load capacitance element 52 provided with the two load capacitances C1 and C2 is used. On the other hand, in ninth preferred embodiment, as shown in FIG. 24, one load capacitance element 72 (load capacitance C1) is mounted between internal connection electrodes 28e and 28c, and the other load capacitance element 73 (load capacitance C2) is mounted between internal connection electrodes 28b and 28c.

Figure 25:
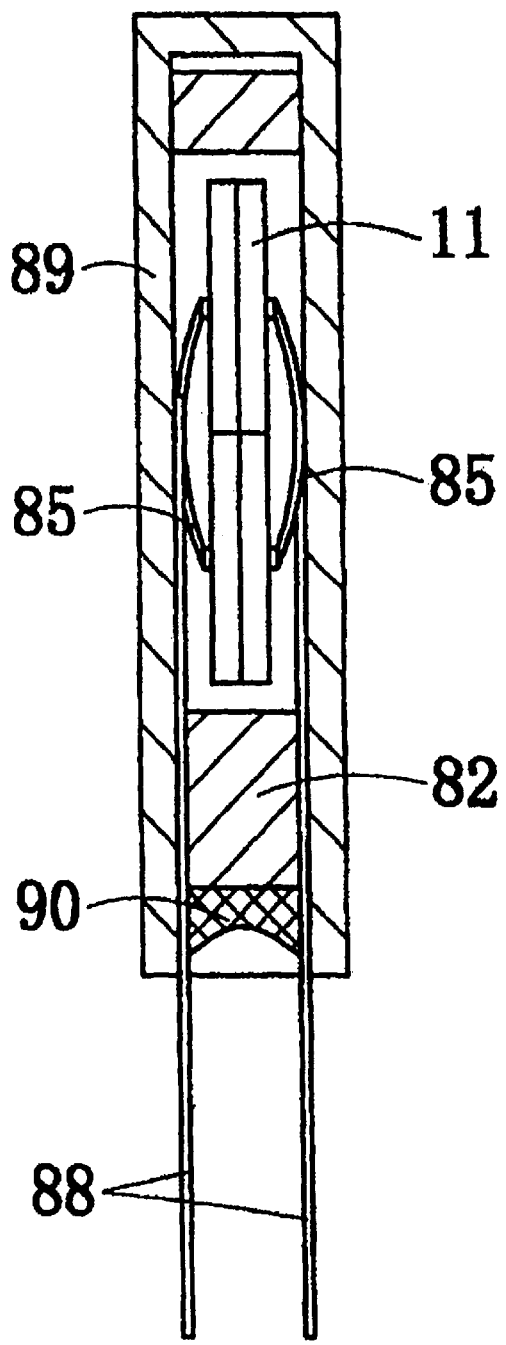
FIG. 25 is a cross-sectional view showing the structure of a piezoelectric component according to a further preferred embodiment of the present invention.

In the respective preferred embodiments described above, the electronic components which are suited for surface mounting are described. Regarding the structures of these electronic components, by changing the structures of a case and a metallic spring terminal, the electronic components may be modified to be such lead-type components in which leads are inserted through the through-holes of the wiring substrates for surface mounting, respectively. FIGS. 25 and 26 show examples of the lead components.

Figure 26A:
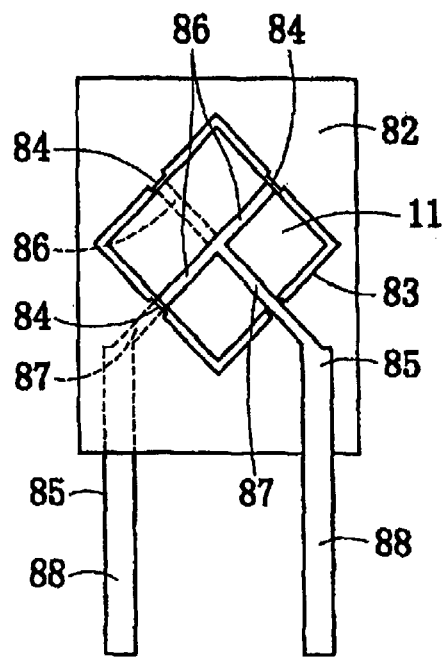
FIG. 26A and 26B are a plan view and a cross-sectional view each showing the state that a bending resonator and a metallic spring terminal are placed in an inner case in the yet another preferred embodiment.
Figure 26B:
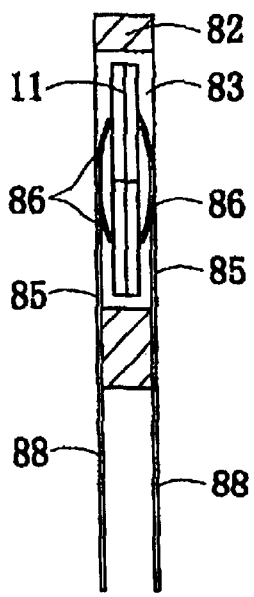

FIG. 25 is a cross-sectional view of a piezoelectric component 81 according to another preferred embodiment of the present invention. FIGS. 26A and 26B are a front view and a cross-sectional view each showing a bending resonator 11 and a metallic spring terminal 85 placed in an inner case 82. The inner case 85 having an angular plate shape is provided with the opening of a cavity 83 into which the bending resonator 11 inclined by about 45° can be placed. The inner peripheral surface of the cavity 83 is provided with positioning portions 84 at four positions for pressing the nodes 15 of the bending resonator 11 into a desired position.

In each metallic spring terminal 85, a lead base portion 87 is extended from the approximate center of two legs 86 bent substantially into an arc shape at approximate right angles to the legs 86. A lead 88 is extended so as to be bent at an angle of about 45° relative to the lead base portion 87. The two legs 86 of each metallic spring terminal 85 press the nodes 15 of the bending resonator 11. The legs 86 of the metallic spring terminal 85 on the front surface and the legs 89 of the metallic spring terminal 86 on the back surface are arranged at an angle of about 90° relative to each other, and press the different nodes 16 from the front surface and the back surface of the bending resonator 11.

The inner case 82 in which the bending resonator 11 and the two metallic spring terminals 85 are placed, as described above and shown in FIGS. 26A and 26B, is inserted into an outer case 89 having an opening at the bottom. The opening of the outer case 89 is sealed with a sealing resin 90.

In this piezoelectric component 81, the bending resonator 11 is used. Accordingly, the piezoelectric component 81 can be greatly reduced in size. Further, the bending resonator 11 that is inclined by about 45°, is placed into the inner case 82, and the lead 88 is inclined at an angle of about 45° to the two legs 86 provided for each metallic spring terminal 85. Therefore, the shapes of the two metallic spring terminals 85 may be the same. Accordingly, the cost is greatly reduced.

As described above, in the piezoelectric resonator according to various preferred embodiments of the present invention, the constant representing the product of the length of one side of the piezoelectric resonator and its resonant frequency is reduced. Accordingly, the length of one side of the piezoelectric resonator can be shortened if the same service frequency band is used, and the piezoelectric resonator can be greatly reduced in size.

Preferably, the piezoelectric resonator using bending vibration is placed in the case, and the external terminals are provided on the outside of the case. Accordingly, the size of the piezoelectric component can be greatly reduced if the service frequency band is the same, and consequently, the piezoelectric resonator is greatly reduced in size. Further, preferably, the piezoelectric resonator in the case is supported at the nodes or the vicinities of the nodes. Thus, damping of the vibration is prevented, though the piezoelectric resonator is placed in the case.

Also preferably, one of the upper surface and the lower surface of the piezoelectric resonator is pressed by the protuberances, and the other is pressed by the metallic spring terminal. Accordingly, only one metallic terminal is required, and the cost of the component is greatly reduced. Further, assemblage of the piezoelectric component can be easily performed.

Still preferably, the lower surface of the piezoelectric resonator is supported by the protuberances, and only the upper surface of the piezoelectric resonator is pressed by the metallic spring terminal. Accordingly, only one metallic spring terminal is required. The cost of the component can be greatly reduced and assemblage of the piezoelectric component is greatly simplified. Moreover, preferably, at least one of the protuberances is made of an electro-conductive material and arranged on one of the inner connection electrodes, the nodes or the vicinities of the nodes of piezoelectric resonator are elastically pressed by the metallic spring terminal inserted between the lower surface of the cap and the piezoelectric resonator, and the metallic spring terminal is electrically connected to the other internal connection electrode via the cap. Accordingly, one of the surface electrodes of the piezoelectric resonator can be electrically connected to one of the external terminals via the electro-conductive protuberance, and the other surface electrode of the piezoelectric resonator can be electrically connected to the other external terminal via the metallic spring terminal and the electro-conductive cap. Thus, wiring steps using lead wires or other connecting members can be omitted.

Preferably, the piezoelectric resonator is sandwiched and held between the metallic spring terminals from both sides thereof. Accordingly, the piezoelectric resonator can be securely supported, due to the elasticity of both the spring terminals.

Also, in another specific form, the piezoelectric resonator is sandwiched and held between the metallic spring terminals from both sides thereof. Accordingly, the piezoelectric resonator can be securely supported, due to the elasticity of both the spring terminals. Further, preferably, the first metallic spring terminal positioned on the lower surface of the piezoelectric resonator is electrically connected to one of the internal connection electrodes, and the second metallic spring terminal positioned on the upper surface of the piezoelectric resonator is electrically connected to the other inner connection electrode via the cap. Accordingly, one of the surface electrodes of the piezoelectric resonator can be electrically connected to one of the external terminals, and the other surface electrode can be electrically connected to the other external terminal via the second metallic spring terminal and the electro-conductive cap. Thus, wiring steps using lead wires or other connecting members can be omitted.

The piezoelectric resonator may be positioned by utilizing the positioning portions for the piezoelectric resonator. In this instance, the structure of the case body is greatly simplified. In addition, since the metallic spring terminal (terminals) are positioned by inserting the end portions thereof into the concavities of the positioning portions, the metallic spring terminal can be securely positioned.

In still another specific form, the metallic spring terminal is positioned by utilizing the positioning portions for positioning the piezoelectric resonator. Accordingly, the structure of the case body is greatly simplified. Also, the positioning portions are arranged to contact the end surfaces of the metallic spring terminal to prevent the metallic spring terminal from rotating. Accordingly, the structure of the positioning portions is not complicated, and incorporation of the metallic spring terminal can be easily performed.

The load capacitance element may be mounted by utilizing the space between the metallic spring terminal and the case body. In this instance, the load capacitance element can be contained without the outer dimensions of the piezoelectric component being increased.

A lead type piezoelectric component can be constructed by using the piezoelectric resonator according to the first aspect of the present invention. The lead type piezoelectric component can be greatly decreased in size even if the same service frequency band is used.

Moreover, the piezoelectric resonator is pressed at the nodes only at two positions on the front side and at the nodes only at two positions on the back surface that is different from the two positions on the front surface, respectively. Accordingly, damping of the vibration of the piezoelectric resonator is prevented. Further, though one of the two metallic spring terminals presses the nodes at the two positions and the other presses the nodes at the two position different from the above-mentioned positions, the two metallic spring terminals of the same shape and size can be used and their leads can be led out in a substantially parallel manner, since the two metallic spring terminals, each inclined at an angle of about 45° relative to the inner case, are placed into the inner case, and the lead type external-terminals each are led out at an angle of about 45° relative to the two legs, respectively. Accordingly, the cost of the metallic spring terminals can be reduced.

It should be understood that the foregoing description is only illustrative of the present invention. Various alternatives and modifications can be devised by those skilled in the art without departing from the invention. Accordingly, the present invention is intended to embrace all such alternatives, modifications and variances which fall within the scope of the appended claims.

What is claimed is:

1. A piezoelectric component comprising:
a piezoelectric resonator including:
at last two piezoelectric layers:
an internal electrode disposed between the at least two piezoelectric layers;
at least two surface electrode disposed on the outer main surfaces of the at least two piezoelectric layers, respectively; wherein
the at least two piezoelectric layers are polarization-treated so that the polarization directions of the at least two piezoelectric layers are substantially perpendicular to the inner electrode and are opposite to each other relative to the internal electrode; and
the at least two piezoelectric layers, the internal electrode and the at least two surface electrodes are arranged to cause the piezoelectric resonator to vibrate in a bending mode when a signal is applied thereto;
a case having the piezoelectric resonator supported therein at at least two nodes or vicinities of at least two nodes of the piezoelectric resonator; and
external terminals disposed on the outside of the case and electrically connected to the at least two surface electrodes of the piezoelectric resonator, respectively; wherein
the piezoelectric resonator is positioned by positioning portions arranged to protrude from an inner peripheral surface of the case, at the positions thereof opposed to the respective at least two nodes or the vicinities of the at least two nodes, and a metallic spring terminal is positioned by inserting end portions of the metallic, spring terminal into concavities provided in at least a portion of said positioning portions.

2. The piezoelectric component according to claim 1, wherein the at least two piezoelectric layers are made of ceramic material and have a substantially square shape.

3. The piezoelectric component according to claim 1, wherein the at last two surface electrodes are arranged to extend along the entire upper major surface and lower major surface of the at least two piezoelectric layers.

4. The piezoelectric component according to claim 1, wherein the product of the length of one side of the piezoelectric resonator and the resonant frequency fr is substantially constant, and expressed by: $L_S \times fr = C_B$ in which $C_B \cong 430$ mm·kHz.

5. A piezoelectric component according to claim 1, wherein the case includes a case body and a cap arranged to cover the case body, a plurally of protuberances disposed on one of the upper surface of the case body and the lower surface of the cap are arranged to contact the at least two nodes or the vicinities of the at least two nodes of the piezoelectric resonator, respectively, and the at least two nodes or the vicinities of the at least two nodes piezoelectric resonator are pressed by a metallic spring terminal inserted between the other of the upper surface of the base body and the lower surface of the cap, and the piezoelectric resonator.

6. A piezoelectric component according to claim 1, wherein the case includes a case body and an electro-conductive cap covering the case body, a pair of the external electrodes are provided on be lower surface of the case body, a pair of internal connection electrodes connected to the external electrodes am provided on the upper surface of the case body, a plurality of protuberances disposed on tho upper surface of the case body are arranged to contact with the at least two nodes of the piezoelectric resonator and the vicinities of the at least two nodes, at least one of the protuberance includes an electro-conductive material and arranged on one of the internal connection electrodes, the at least two nodes and the vicinities of the at least two nodes of the piezoelectric resonator are elastically pressed by a metallic spring terminal inserted between the lower surface of the cap and the piezoelectric resonator, and the metallic spring terminal is electrically connected to the other internal connection electrode via the cap.

7. A piezoelectric component according to claim 1, wherein the case includes a case body and a cap covering the case body, a first metallic spring terminal, the piezoelectric resonator, and a second metallic spring terminal are inserted between the case body and the cap, and the at least two nodes or the vicinities of the at least two nodes of the piezoelectric resonator are elastically sandwiched between both the metallic spring terminals.

8. A piezoelectric component according to claim 1, wherein the case includes a case body and an electro-conductive cap covering the case body, a pair of the external terminals are provided on the lower surface of the case body, a pair of the internal connection electrodes electrically connected to the respective external terminals are provided on the upper surface of the case body, a first metallic spring terminal, the piezoelectric resonator, and a second metallic spring terminal are inserted between the case body and the cap, the at least two nodes and the vicinities of the at least two nodes of the piezoelectric resonator are elastically sandwiched and held between both the metallic spring terminals, the first metallic spring terminal positioned on the lower surface of the piezoelectric resonator is arrange to contact one of the internal connection electrodes, and the second metallic spring terminal positioned on the upper surface of the piezoelectric resonator is electrically connected to the other internal connection electrode via the cap.

9. A piezoelectric component according to claim 7, wherein a load capacitance element is mounted onto the case body in a space between one of the first metallic spring terminal and the second metallic spring terminal that is arranged on the lower surface of the piezoelectric resonator and the case body.

10. A piezoelectric component according to claim 1, wherein the case includes an inner case and an outer case having a box-shape arranged to accommodate the inner case, the piezoelectric resonator is inclined by about 45° relative to the inner case and is placed in the inner case, one of two metallic spring terminals each having a lead external terminal extended substantially at about 45° relative to the two legs is arranged on the front surface of the piezoelectric resonator to press the at least two nodes or the vicinities of the at least two nodes, and the other metallic spring terminal is arranged on the back surface of the piezoelectric resonator to press the nodes at the remaining two positions.

* * * * *